United States Patent
Hahn et al.

(10) Patent No.: US 10,680,135 B2
(45) Date of Patent: Jun. 9, 2020

(54) OPTOELECTRONIC COMPONENT WITH ESD PROTECTION

(71) Applicant: OSRAM OLED GMBH, Regensburg (DE)

(72) Inventors: Berthold Hahn, Hemau (DE); Korbinian Perzlmaier, Regensburg (DE); Christian Leirer, Friedberg (DE); Anna Kasprzak-Zablocka, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/770,334

(22) PCT Filed: Oct. 24, 2016

(86) PCT No.: PCT/EP2016/075555
§ 371 (c)(1),
(2) Date: Apr. 23, 2018

(87) PCT Pub. No.: WO2017/072074
PCT Pub. Date: May 4, 2017

(65) Prior Publication Data
US 2018/0315891 A1    Nov. 1, 2018

(30) Foreign Application Priority Data

Oct. 26, 2015   (DE) .................. 10 2015 118 234

(51) Int. Cl.
*H01L 33/38* (2010.01)
*H01L 33/36* (2010.01)
(Continued)

(52) U.S. Cl.
CPC ............ *H01L 33/385* (2013.01); *H01L 24/45* (2013.01); *H01L 33/36* (2013.01); *H01L 33/44* (2013.01);
(Continued)

(58) Field of Classification Search
CPC ........ H01L 33/385; H01L 33/36; H01L 33/62
See application file for complete search history.

(56) References Cited

U.S. PATENT DOCUMENTS

2005/0168899 A1*  8/2005  Sato .................. H01L 27/15
                                              361/91.1
2006/0044711 A1*  3/2006  Wiseman ............ H02M 5/4505
                                              361/23

(Continued)

FOREIGN PATENT DOCUMENTS

DE    102012208730 A1   11/2013
DE    102013113603 A1   12/2014
WO      2015/016561 A1    2/2015

*Primary Examiner* — Allen L Parker
*Assistant Examiner* — Gustavo G Ramallo
(74) *Attorney, Agent, or Firm* — MH2 Technology Law Group, LLP

(57) ABSTRACT

The invention relates to an optoelectronic component (100) comprising a semiconductor layer sequence (1) having an active layer (10), wherein the active layer (10) is designed to produce or absorb electromagnetic radiation in intended operation. Furthermore, the component (100) comprises a first contact structure (11) and a second structure (12), by means of which the semiconductor layer sequence (1) can be electrically contacted in intended operation. In operation, a voltage is applied to the contact structures (11, 12), wherein an operation-related voltage difference ΔUbet between the contact structures (11, 12) arises. When the voltage difference is increased, a first arc-over occurs in or on the component (100) between the two contact structures (11, 12). A spark gap (3) between the contact structures (11, 12), (Continued)

Figure 1A:
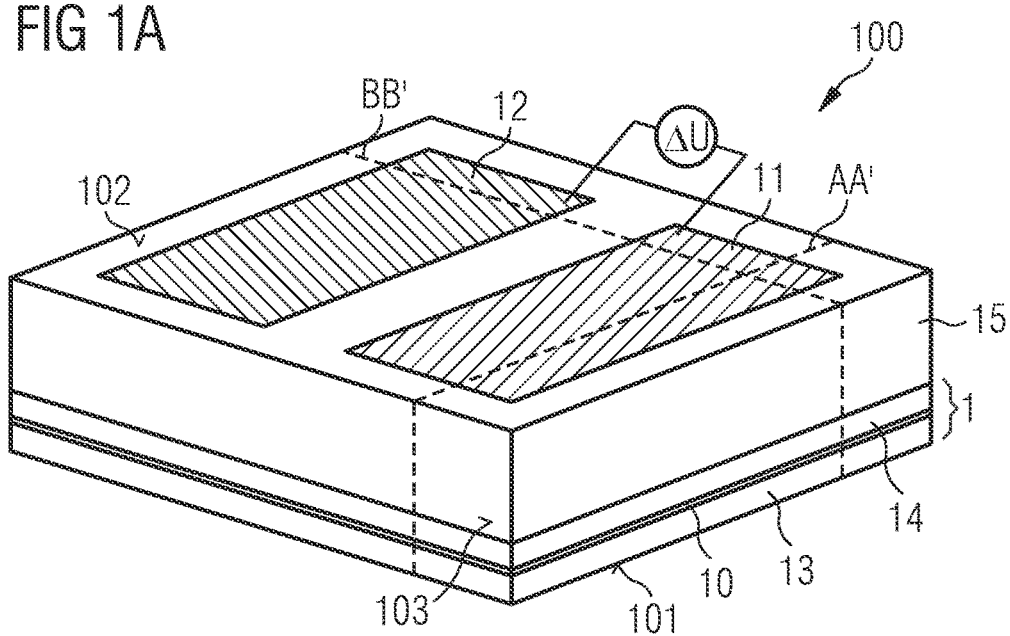

which arises in the event of the first arc-over, passes predominantly through a surrounding medium in the form of gas or vacuum and/or through a potting. The first arc-over occurs at a voltage difference of 2·ΔUbet at the earliest.

18 Claims, 13 Drawing Sheets

(51) Int. Cl.
    *H01L 33/62*     (2010.01)
    *H01L 23/00*     (2006.01)
    *H01L 33/44*     (2010.01)

(52) U.S. Cl.
    CPC .... *H01L 33/62* (2013.01); *H01L 2224/48091* (2013.01); *H01L 2224/48464* (2013.01); *H01L 2224/73265* (2013.01); *H01L 2924/00014* (2013.01)

(56) References Cited

U.S. PATENT DOCUMENTS

| | | | |
|---|---|---|---|
| 2010/0003787 A1* | 1/2010 | Wang | H01L 23/3677 438/118 |
| 2011/0006195 A1* | 1/2011 | Prendergast | G01T 1/2907 250/252.1 |
| 2015/0138827 A1 | 5/2015 | Song et al. | |
| 2015/0255693 A1* | 9/2015 | Baade | H02H 3/20 257/99 |
| 2015/0380620 A1* | 12/2015 | Chae | H01L 33/38 257/98 |

* cited by examiner

OPTOELECTRONIC COMPONENT WITH ESD PROTECTION

CROSS-REFERENCE OF RELATED APPLICATIONS

This application is the U.S. National Phase under 35 U.S.C. § 371 of International Patent Application No. PCT/EP2016/075555, filed on Oct. 24, 2016, which in turn claims the benefit of German Application No. 102015118234.3, filed on Oct. 26, 2015, the entire disclosures of which Applications are incorporated by reference herein.

An optoelectronic component is specified.

An object to be achieved is to specify a simply constructed optoelectronic component which is less prone to damage in the event of overvoltages.

According to at least one embodiment, the optoelectronic component comprises a semiconductor layer sequence with an active layer. The active layer is set up to generate or absorb electromagnetic radiation, such as visible light or UV radiation or infrared radiation, during normal operation.

The semiconductor layer sequence is based for example on a U-V compound semiconductor material. The semiconductor material is, for example, a nitride compound semiconductor material such as $Al_n In_{1-n-m} Ga_m N$, or a phosphide compound semiconductor material such as $Al_n In_{1-n-m} Ga_m P$, or also an arsenide compound semiconductor material such as $Al_n In_{1-n-m} Ga_m As$, where $0 \leq n \leq 1$, $0 \leq m \leq 1$ and $m+n \leq 1$, respectively. In this case, the semiconductor layer sequence can have dopants and additional constituents. For the sake of simplicity, however, only the essential constituents of the crystal lattice of the semiconductor layer sequence, that is to say Al, As, Ga, In, N or P, are indicated, even if these can be partially replaced and/or supplemented by small amounts of further substances. The semiconductor layer sequence is preferably based on AlInGaN.

The active layer has, for example, at least one pn-junction and/or one quantum well structure in the form of a single quantum well, SQW for short, or in the form of a multi-quantum well structure, MQW for short.

According to at least one embodiment, the component comprises a first contact structure and a second contact structure, via which the semiconductor layer sequence can be electrically contacted or via which the semiconductor layer sequence is contacted during normal operation. Both, the first and the second contact structure can each be in direct electrical and mechanical contact with a semiconductor layer of the semiconductor layer sequence.

The first contact structure is, for example, an n-contact structure and electrically conductively connected to an n-type semiconductor layer of the semiconductor layer sequence. The second contact structure is, for example, a p-type contact structure which is electrically conductively connected to a p-type semiconductor layer of the semiconductor layer sequence.

The contact structures comprise, for example, a metal, such as Ag, Al, Au, Ti, Pd, or consist thereof. However, it is also possible that the contact structures comprise or consist of a transparent conductive material, TCO for short, such as indium tin oxide, ITO for short, or $ZnO_2$.

According to at least one embodiment, the contact structures are subjected to a voltage during operation, wherein an operating voltage difference $\Delta U_{bet}$ occurs between the contact structures. In normal operation, the first contact structure and the second contact structure are therefore at different electrical potentials. The semiconductor layers, which are electrically contacted via the contact structures, are preferably at the same or almost the same potential as the associated contact structures. In particular, a voltage drop of $\Delta U_{bet}$ or of almost $\Delta U_{bet}$ occurs in the semiconductor layer sequence in the region of the active layer.

Conventional operating voltages of optoelectronic components, which are preferred here, such as LEDs or laser diodes, are in the range of between 1 V and 300 V or between 1 V and 10 V, in particular between 1 V and 5 V. For example, typical operating voltages or voltage drops are in the range of 1.2 V to 1.8 V for infrared LEDs, in the range of 1.6 V to 2.2 V for red LEDs, in the range of 1.9 V to 5 V for yellow to green LEDs, and in the range of 2.7 V to 4 V for blue or UV LEDs. Infrared laser diodes are typically operated with operating voltages in the range of 1.8 V to 2.2 V. Components with several LEDs, for example connected in series, so-called multi junction LEDs, can also have operating voltages up to 100 V or 300 V.

According to at least one embodiment, when the voltage difference between the two contact structures increases, a first electrical flashover occurs in or on the component. The first electrical flashover is the first flashover, which occurs at all in the component or on the component as the voltage difference increases. Upon further increase in the voltage difference, further flashovers may occur in regions of the component. However, the first electrical flashover occurs exclusively and always between the two contact structures. In particular, the dielectric strength between the two contact elements is the lowest.

According to at least one embodiment, the contact structures are constructed or configured such that a spark gap arising between the contact structures during the first flashover runs predominantly through a surrounding medium adjacent to the component in the form of gas or vacuum and/or through an potting around the component. In the first flashover, a spark gap or, in other words, a current path is formed between the two contact structures for a short time. Charge carriers are exchanged between the contact structures via the current path, so that the voltage difference between the contact structures is reduced. The majority of the path traveled by the exchanged charge carriers along the current path runs through the surrounding medium and/or through the potting.

For example, for this purpose, the first and the second contact structure are guided on a side surface or outer surface or edge surface of the component. The side surface, for example, partially or completely adjoins the surrounding medium or the potting.

In order to achieve that the spark gap of the first flashover occurs specifically in a certain medium and not somewhere in the component, various approaches can be followed. For example, the spacings of the contact structures in the region of the medium can be selected to be correspondingly small. The shape of the contact structures can also play a role. For example, flashover in the area of tips is more likely. Furthermore, it can also be influenced by the choice of dielectrics between the contact structures, where a flashover occurs. Overall, therefore, several factors contribute to where exactly the spark gap occurs. Depending on the requirements, the distances and the geometries as well as the materials used can be matched to one another in order to obtain the spark gap in the desired region.

The term "predominantly" is understood here and below as meaning that the spark gap or the path traveled by the charge carriers runs to at least 50% or at least 70% or at least 90% or at least 95% or at least 99% or completely through the surrounding medium.

The spark gap can form a straight line in the Euclidean space. However, the spark gap is preferably formed by the path which forms the least electrical resistance for the exchanged charge carriers. The spark gap can thus also have a curvature, for example, in order not to have to cross over regions with higher resistance, but to avoid it.

The gas may, for example, be air or an inert gas, such as Nitrogen, or a noble gas, such as Neon or Xenon, or Argon or Helium.

The potting may, for example, comprise or consist of a silicone or epoxy resin in which optionally converter particles are incorporated. The potting preferably has an encapsulating or protective or light-converting or efficiency-enhancing or beam-forming effect on the component. A potting is understood to be, for example, an element that can change the properties of the component, but which is not absolutely necessary to operate the component or to make it functional. In particular, the component can radiate or absorb electromagnetic radiation even without the potting. Preferably, the potting is not necessary in order to support and stabilize the semiconductor layer sequence of the component or the component itself. The potting can then give the semiconductor layer sequence or the component, for example, at most an additional stability. The potting is thus for example neither a carrier nor a substrate of the component. Preferably, the potting also does not form part of the component, but is a separate component.

According to at least one embodiment, the first flashover occurs at the earliest at a voltage difference of $2 \cdot \Delta U_{bet}$ or $2{,}5 \cdot \Delta U_{bet}$ or $3 \cdot \Delta U_{bet}$. Alternatively or additionally, the first flashover may occur at the latest at a voltage difference of $1000 \cdot \Delta U_{bet}$ or $500 \cdot \Delta U_{bet}$ or $100 \cdot \Delta U_{bet}$ or $20 \cdot \Delta U_{bet}$ or $10 \cdot \Delta U_{bet}$ or $5 \cdot \Delta U_{bet}$.

In at least one embodiment, the optoelectronic component comprises a semiconductor layer sequence with an active layer, wherein the active layer is set up to generate or absorb electromagnetic radiation during normal operation. Furthermore, the component comprises a first contact structure and a second contact structure, via which the semiconductor layer sequence can be electrically contacted. During operation, the contact structures are subjected to a voltage, whereby an operational voltage difference $\Delta U_{bet}$ occurs between the contact structures. As the voltage difference increases, a first flashover occurs in or on the component between the two contact structures. A spark gap produced between the contact structures during the first flashover runs predominantly through a surrounding medium in the form of gas or vacuum and/or through a potting around the component. The first flashover occurs at the earliest at a voltage difference of $2 \cdot \Delta U_{bet}$.

For the invention described here, use is made in particular of the idea of deriving a potentially harmful voltage for the component via a gas flashover, in particular an air flashover. Depending on temperature and humidity, air has a dielectric strength of about 3 kV/mm. Accordingly, a maximum voltage, which may occur in the optoelectronic component, can be defined in air over a defined distance of a p-contact structure and an n-contact structure from one another. At a distance of 100 μm, these are for example 300 V, for 10 μm only 30 V. The prerequisite for the flashover or the spark gap to occur in air is that the structure and the materials of the component are selected accordingly.

In particular, for example, the breakdown voltage of the diode formed by the semiconductor layer sequence should be higher than the voltage difference at which the first flashover occurs between the contact structures. The dielectric strength of the materials installed in the component between the contact structures should also be selected to be correspondingly large. In this way, flashovers through dielectrics or epitaxial layers within the component can be avoided. If the flashover occurs in a surrounding gas, such as air, then preferably no or only slight damage to the component occurs.

According to at least one embodiment, the component has a region on a side surface or outer surface in which the dielectric strength is lowest over the entire component. This can be achieved in particular by a small distance of the contact structures in the region of this side surface.

According to at least one embodiment, an ESD protection circuit of the optoelectronic component is realized by the two contact structures. A further protection circuit within the component, such as an ESD diode, is then unnecessary or not provided in the component. In particular, the ESD protection circuit operates independently of the current intensity occurring in the component and, for example, always switches on at the same electrical voltage difference, regardless of the current intensity. By switching through the ESD protection circuit, i.e. by the occurrence of the first flashover, the ESD protection circuit is preferably not destroyed or damaged and then works the same as before.

According to at least one embodiment, the first electrical flashover occurs at the earliest at a voltage difference of 3 V or 5 V or 10 V or 25 V. Alternatively or additionally, the first electrical flashover occurs at the latest at a voltage difference of 8000 V or 3000 V or 1000 V or 500 V or 100 V or 80 V or 50 V or 10 V or 5 V.

According to at least one embodiment, the contact structures adjoin at least in some regions directly to the surrounding medium and/or the potting. For example, the contact structures in the mounted or unmounted configuration of the component are at least partially exposed to side surfaces of the component or adjoin the potting there. Preferably, the spark gap then runs exclusively through the surrounding medium and/or the potting.

According to at least one embodiment, a passivation layer is arranged at least partially between the contact structures and the surrounding medium. The passivation layer is, for example, an electrically insulating layer, for example of silicon oxide, such as $SiO_2$, or of silicon nitride, such as SiN, or of aluminum oxide, such as $Al_2O_3$. The passivation layer protects the contact structures in particular against external influences. The thickness of the passivation layer is, for example, between 5 nm and 100 nm inclusive. In this case, the spark gap between the contact structures may pass through the passivation layer and may, for example, run to at least 90% through the surrounding medium and/or the potting.

According to at least one embodiment, the minimum distance between the two contact structures in the region of the forming spark gap is at most 50 μm or at most 40 μm or at most 30 μm. Alternatively or additionally, the minimum distance in this region is at least 5 μm or at least 10 μm or at least 20 μm. For example, the spark gap is formed in a region between the contact structures in which the distance between the contact structures is the lowest. In all other areas, for example, the distance between the contact structures is larger than in the region of the spark gap.

According to at least one embodiment, the contact structures each have a tip or edge, wherein the spark gap is formed between the tips or edges of the two contact structures. Preferably, the tips or edges of the contact structure are facing each other. An angle of the tip or edge is, for example, at most 90° or at most 60° or at most 30°. Alternatively or additionally, the angle is at least 10° or at least 20° or at least 30°. A tip may in particular be a triangular or pyramidal protruding region of the contact structure. It goes without saying that the tip does not have to be an ideal tip. Rather, the tip may be rounded, for example, with a radius of curvature of at most 10 µm or at most 1 µm. Preferably, the rounding is negligibly small compared to the extension of the tip.

In the region of tips or edges particularly high field strengths occur, which is why in these regions the flashover probability is increased. When using tips or edges, the distance between the tips or edges can therefore be made larger. For example, the distance between the tips or edges of the contact structures, between which the first flashover occurs, is greater than the distance between the two contact structures in another region.

According to at least one embodiment, the contact structures are each formed in one piece or contiguously. By way of example, the contact structures between a semiconductor layer contacted by the respective contact structure and the side surface of the component on which the first flashover occurs are formed in one piece or in a contiguous manner.

According to at least one embodiment, the contact structures are contact elements for external electrical contacting, which are exposed on a side face of the component in the unmounted configuration of the component. The contact elements may be, for example, solder pads on side surfaces of the component. It is also possible that the contact elements are parts of vias in the component. For example, on a side surface of the component, the contact elements may protrude.

The contact structures may, for example, be defined lithographically, for example via a lift-off process or via an etching process or via sputtering or via vapor deposition. The contact structures can also be produced by electrochemical deposition. Furthermore, the contact structures can be surface-finished on side surfaces, for example via electrochemical deposition.

According to at least one embodiment, the contact structures are current distribution structures of the semiconductor layer sequence. By way of example, the current distribution structures are strip-shaped or grid-shaped elements in or on semiconductor layers of the semiconductor layer sequence. The current distribution structures preferably extend over a majority of the lateral extent of the semiconductor layer sequence. Current can then be efficiently distributed along the lateral extent of the semiconductor layer sequence and injected into the semiconductor layers of the semiconductor layer sequence via the current distribution structures. A lateral direction is in particular a direction parallel to the active layer of the semiconductor layer sequence.

According to at least one embodiment, the optoelectronic component has a radiation side for coupling or decoupling the electromagnetic radiation into or out of the component. Furthermore, the component comprises a rear side opposite the radiation side. The rear side and the radiation side are connected to one another by at least one transverse side. The radiation side and the rear side preferably run parallel or substantially parallel to the active layer.

According to at least one embodiment, the component comprises a carrier carrying the semiconductor layer sequence. The carrier may be, for example, a substrate of the semiconductor layer sequence, such as a growth substrate, for example of sapphire or GaN or Si or SiC. It is also possible for the carrier to be a carrier different from the growth substrate, for example a potting body, for example made of plastic or silicone, or a ceramic carrier or a printed circuit board. The carrier is preferably the only mechanically self-supporting element in the component. The growth substrate is detached, for example.

Alternatively, additionally to the carrier, should this be different from the growth substrate, the component may also have the growth substrate of the semiconductor layer sequence. The semiconductor layer sequence is then preferably arranged between the carrier and the growth substrate.

The carrier may be formed, for example, between the semiconductor layer sequence and the radiation side or between the semiconductor layer sequence and the rear side.

According to at least one embodiment, the semiconductor layer sequence comprises a first semiconductor layer facing the radiation side and a second semiconductor layer facing away from the radiation side. The first semiconductor layer and the second semiconductor layer may in turn comprise a composite of semiconductor layers. In particular, the first semiconductor layer is the entire layer composite between a first main side of the semiconductor layer sequence and the active layer. The second semiconductor layer is preferably the entire layer composite between the active layer and a second main side of the semiconductor layer sequence. The active layer is therefore preferably arranged between the first semiconductor layer and the second semiconductor layer.

According to at least one embodiment, the first contact structure is electrically conductively connected to the first semiconductor layer, the second contact structure is electrically conductively connected to the second semiconductor layer.

According to at least one embodiment, in the case of the first electrical flashover, the spark gap is formed in the region of the rear side or in the region of the radiation side or in the region of the transverse side of the component.

According to at least one embodiment, the first contact structure is arranged on a side of the first semiconductor layer facing away from the carrier. The second contact structure is arranged, for example, on a side of the second semiconductor layer facing away from the carrier within a recess in the first semiconductor layer. The recess thus completely traverses the first semiconductor layer and the active layer and terminates in the second semiconductor layer. The first contact structure and the second contact structure are preferably exposed on the radiation side, so that the component can be contacted by the radiation side facing away from the carrier.

According to at least one embodiment, the second contact structure on the radiation side projects beyond the first semiconductor layer in the direction away from the carrier. Preferably, the shortest connection between the two contact structures, in particular the spark gap between the two contact structures, then runs through no part of the semiconductor layer sequence. The shortest connection is in particular the shortest space connection that is defined geometrically by a straight line.

According to at least one embodiment, the contact structures form at least parts of vias through the carrier. By way of example, the contact structures are then exposed as contact elements in the unmounted configuration of the component on the rear side of the component.

According to at least one embodiment, the contact structures in the region of the carrier are guided both to the rear side and to the transverse side and are preferably exposed in the unmounted configuration of the component both on the rear side and on the transverse side. The spark gap then occurs, for example, in the region of the transverse side.

According to at least one embodiment, an edge between the rear side and the transverse side is free of the contact structures. The regions of the first and second contact structures that, in the unmounted configuration, are exposed on the transverse side and rear side are thus not mutually connected to each other, but interrupted at the edge.

Preferably, in this case, the spark gap occurs in the region of the transverse side and at a distance from the rear side. The spark gap occurs, in particular, at a vertical distance of at least 20 μm or 50 μm or 100 μm from the rear side. "Vertical" is a direction perpendicular to the main extension direction of the rear side. In this way, the rear side with any contact structures can be protected from damage by the flashover.

According to at least one embodiment, the contact structures are guided on an edge between the transverse side and the rear side. In other words, the regions of the first contact structure and the second contact structure that are exposed in the unmounted configuration of the component on the rear side and on the transverse side are each formed contiguously and are not interrupted at the edge. For example, in this case the spark gap occurs in the region of the edge or can occur in the region of the edge.

According to at least one embodiment, the optoelectronic component is a semiconductor chip. In this case, a semiconductor chip is understood to be a component that arises immediately after the singulation, for example from a wafer or a wafer composite or a carrier or a carrier composite. The semiconductor chip is thus a component, which has not been further processed after separation, in particular has not been further mounted on other components. The lateral extent of the semiconductor layer sequence then corresponds, for example, substantially to the lateral extent of the semiconductor chip and/or of the carrier. "Substantially" means, for example, that the differences in lateral extent are at most 20%, or at most 10%, or at most 5%.

According to at least one embodiment, the optoelectronic component is a light-emitting diode with an optoelectronic semiconductor chip mounted on a carrier. Unlike before, the semiconductor chip is therefore already processed in this case and mounted on a carrier. The semiconductor chip comprises the semiconductor layer sequence. Preferably, a lateral extent of the carrier is at least twice as large as the lateral extent of the semiconductor layer sequence.

Furthermore, a method for operating an optoelectronic component is specified. In particular, the optoelectronic component specified here is suitable for being operated with the method. That is, all features disclosed in connection with the optoelectronic component are also disclosed for the method and vice versa.

According to at least one embodiment, the method for operating an optoelectronic component comprises a step A), in which an optoelectronic component, in particular a component as described so far, having a first contact structure and a second contact structure is provided. In a step B), the optoelectronic component is electrically contacted via the first and second contact structures. In a step C), the optoelectronic component is then switched on and off by controlled switching on and off of a current flow through the optoelectronic component. In the switched-on state of the optoelectronic component an intended voltage difference $\Delta U_{bet}$ is applied between the two contact structures. In this case, the optoelectronic component emits electromagnetic radiation, preferably in the visible range. For example, both, in the switched-on as well as in the switched-off state occasionally and in particular uncontrolled voltage spikes occur at the component. The voltage peaks are preferably short-term increases in the voltage difference between the two contact structures to values greater than $\Delta U_{bet}$. For some voltage spikes, a first electrical flashover forms in or on the component between the two contact structures. A spark gap formed between the contact structures during the first flashover runs predominantly through a surrounding medium in the form of gas or vacuum and/or through a potting around the component. The first flashover occurs at the earliest at a voltage difference of $2 \cdot \Delta U_{bet}$.

The steps A) to C) are preferably carried out in the stated sequence.

Hereinafter, an optoelectronic component described herein will be described in more detail with reference to drawings by means of exemplary embodiments. Here, like reference numerals indicate like elements in the figures. However, the size ratios involved are not to scale, individual elements may rather be illustrated with an exaggerated size for a better understanding.

Figure 1B:
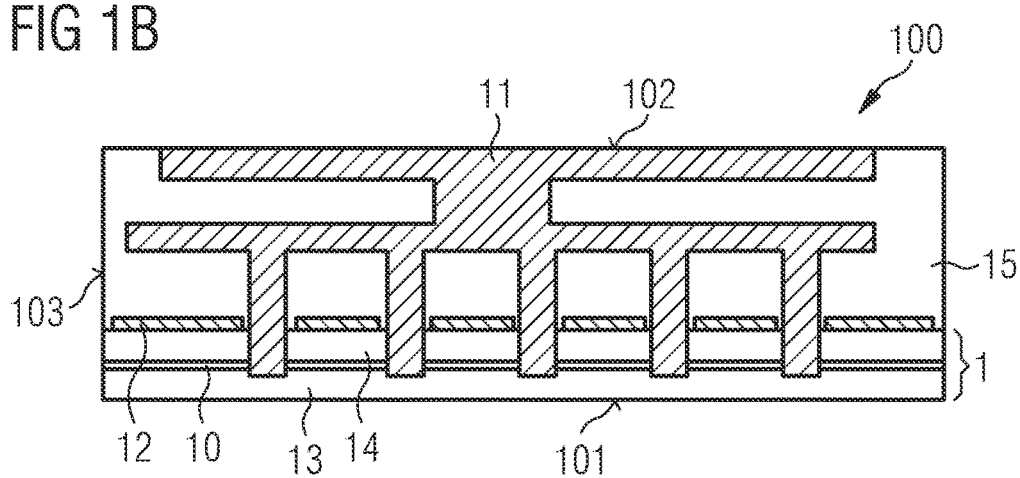
Figure 1C:
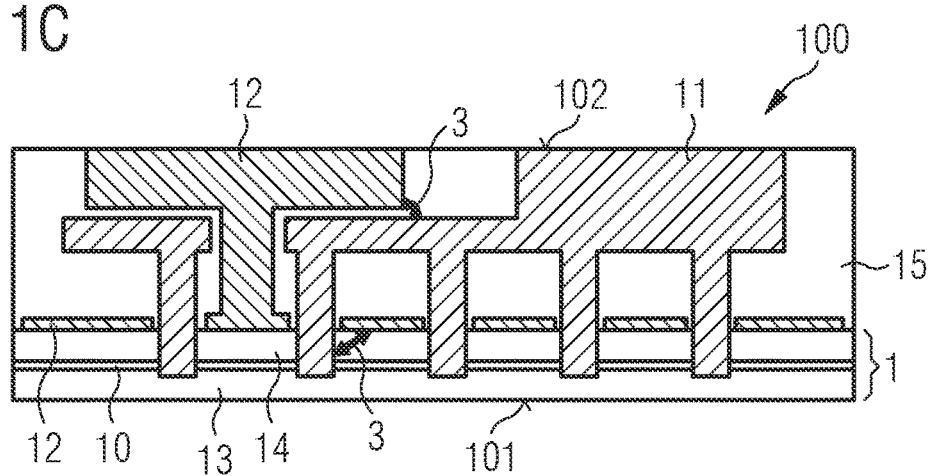

As shown in:

FIGS. 1A to 1C alternative optoelectronic components in 3D view and cross-sectional view, FIGS. 2A to 8D exemplary embodiments of components in 3D view, side cross-sectional views and plan views.

FIG. 1A shows an alternative component in a 3D view. This is a semiconductor chip, as it is present immediately after the separation of a carrier composite. In this case, a semiconductor layer sequence 1, which is applied directly to a carrier 15, can be seen. The carrier 15 differs from a growth substrate of the semiconductor layer sequence 1 and stabilizes the semiconductor layer sequence 1 mechanically. The growth substrate of the semiconductor layer sequence is removed in the component 100. Evident are also a first contact structure 11 and a second contact structure 12, which are exposed on a rear side 102, in the present case formed by a side of the carrier 15 facing away from the semiconductor layer sequence 1. A radiation side 101 is arranged opposite the rear side 102, wherein the semiconductor layer sequence 1 is arranged between the radiation side 101 and the carrier 15. The rear side 102 and the radiation side 101 are connected to one another via a transverse side 103. During operation, electromagnetic radiation is coupled out of the component 100 or coupled into the component 100 via the radiation side 101.

The carrier 15 is, for example, a ceramic carrier or a plastic carrier or a metal carrier or a semiconductor carrier.

The semiconductor layer sequence 1 is preferably not mechanically self-supporting and is based, for example, on GaN. In this case, the semiconductor layer sequence 1 comprises a first semiconductor layer 13 and a second semiconductor layer 14, between which an active layer 10 is arranged. Via the active layer 10, electromagnetic radiation is generated or absorbed during normal operation.

The first contact structure 11 and the second contact structure 12 are formed for example of a metal, such as silver or aluminum or gold, and are spaced from each other and are electrically insulated from each other by the carrier 15 at the rear side 102. In particular, the contact structures 11, 12 are completely surrounded in each case by the carrier 15 and terminate flush with the carrier 15 at the rear side 102. The first contact structure 11 is electrically conductively connected to the first semiconductor layer 13, the second contact structure 12 is electrically conductively connected to the second semiconductor layer 14. During operation, the contact structures 11, 12 exposed on the rear side 102 can thus serve for external electrical contacting. The component 100 of FIG. 1A is a surface mountable component.

Furthermore, it can be seen in FIG. 1A that a voltmeter, which measures a voltage difference $\Delta U$ between the two contact structures 11, 12, is arranged between the first contact structure 11 and the second contact structure 12. In normal operation, the voltage difference ΔU is equal to a voltage difference $\Delta U_{bet}$.

FIG. 1B shows a component 100 in a cross-sectional view along the plane AA' from FIG. 1A. It can be seen that the first contact structure 11 is exposed on the rear side 102 and is in direct electrical and mechanical contact with the first semiconductor layer 13. In particular, the first contact structure 11 is a via through the carrier 15. In the region of the semiconductor layer sequence 1, the first contact structure 11 forms a plurality of vias through the second semiconductor layer 14 and the active layer 12, which then open into the first semiconductor layer 13. In this case, the first contact structure 11 is contiguous from the rear side 102 to the first semiconductor layer 13.

FIG. 1C shows a lateral cross-sectional view along the plane BB' of FIG. 1A. On display are the first contact structure 11 and the second contact structure 12, which extend through the carrier 15 and are each formed contiguously. The second contact structure 12 is exposed on the rear side 102 of the component 100 and is in direct contact with the second semiconductor layer 14. The first contact structure 11 is electrically insulated from the second contact structure 12 by the carrier 15.

Furthermore, it is indicated in FIG. 1C in which regions electrical flashovers and corresponding spark gaps 3 can occur. The spark gaps 3 are shown as double arrows between the first contact structure 11 and the second contact structure 12. Such an electrical flashover occurs as soon as the voltage difference ΔU between the first contact structure 11 and the second contact structure 12 exceeds the dielectric strength of the material between the first contact structure 11 and the second contact structure 12. In FIG. 1C, the flashovers occur within the component 100, so that the spark gap 3 runs in the region of the carrier 15 or in the region of the semiconductor layer sequence 1. The spark gap 3 may cause damage, such as burns, within the carrier 15 or the semiconductor layer sequence 1.

Figure 2A:
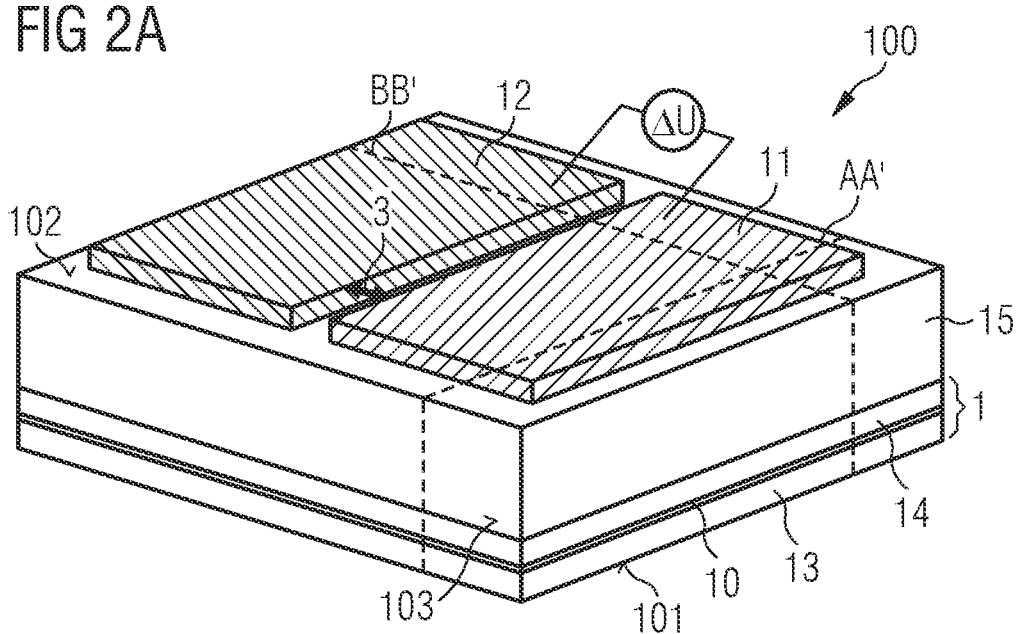
Figure 2B:
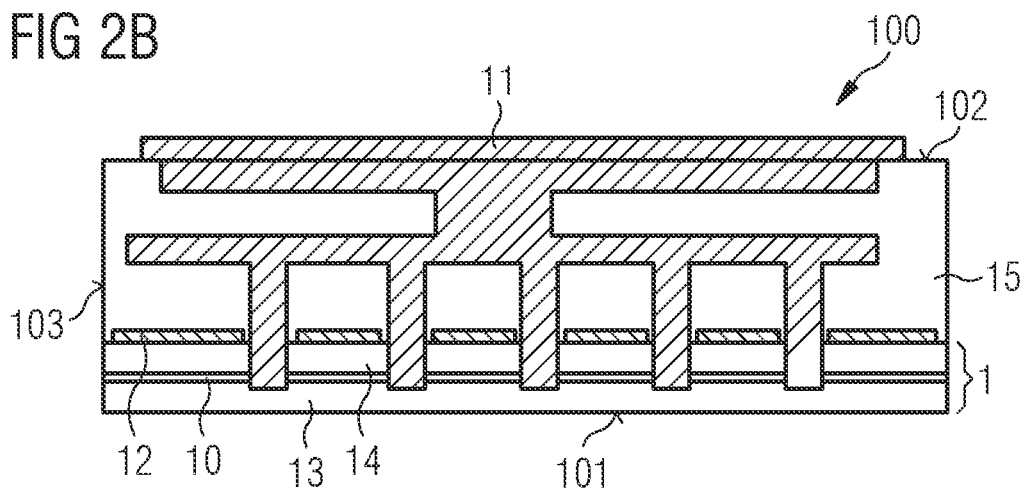
Figure 2C:
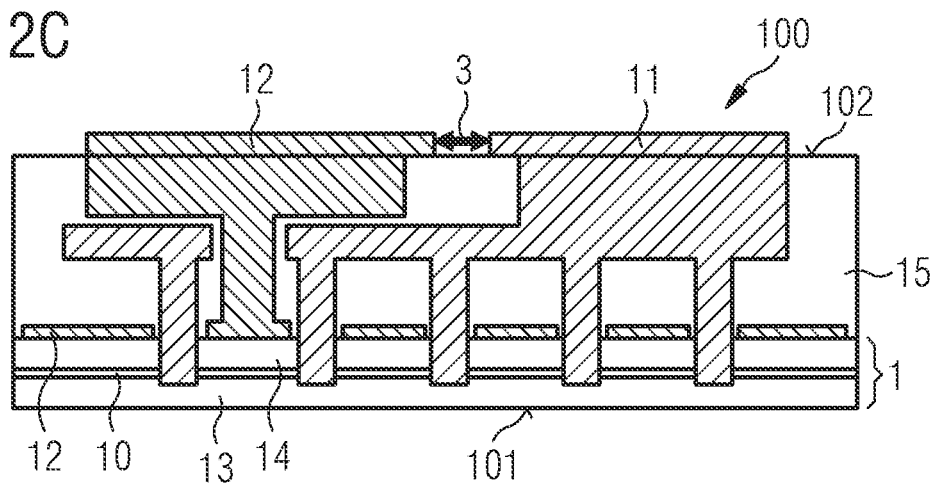

In the exemplary embodiment of FIGS. 2A to 2C, substantially the same component 100 is shown as in FIGS. 1A to 1C. Unlike in FIGS. 1A to 1C, however, contact elements, such as soldering pads, are now applied to the contact structures 11, 12 in the region of the rear side 102, which now each form part of the contact structures 11, 12 and protrude on the rear side 102. The contact elements are for example produced lithographically by a lift-off or an etching process or sputtering or vapor deposition or by a galvanic process.

Overall, the spacing of the contact structures 11, 12 in the region of the rear side 102 is reduced by the application of the contact elements. If the voltage difference between the first contact structure 11 and the second contact structure 12 is now continuously increased starting from $\Delta U_{bet}$, then a first electrical flashover occurs on or in the component 100 between the first contact structure 11 and the second contact structure 12 in the region of the rear side 102. In particular, the spark gap 3 extends to at least 95% through a surrounding medium of gas or vacuum adjacent to the component 100. In contrast to FIG. 1C, the spark gap 3 is led out of the component 100 so that there is no or reduced damage to or in the component 100 in the event of a flashover.

Figure 2D:
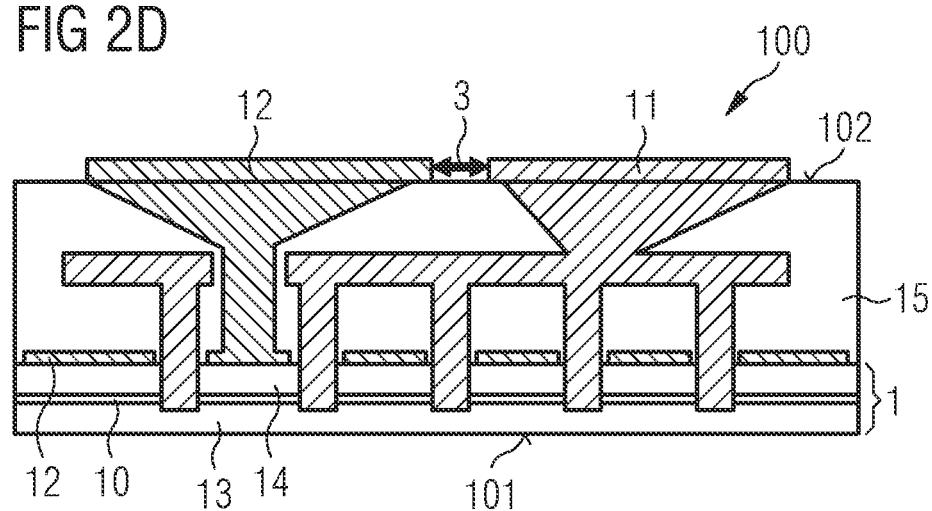

FIG. 2D shows a further exemplary embodiment of a component 100 in cross-sectional view along the plane BB'. In this case, the distance between the first contact structure 11 and the second contact structure 12 initially increases continuously starting from the rear side 102.

Figure 2E:
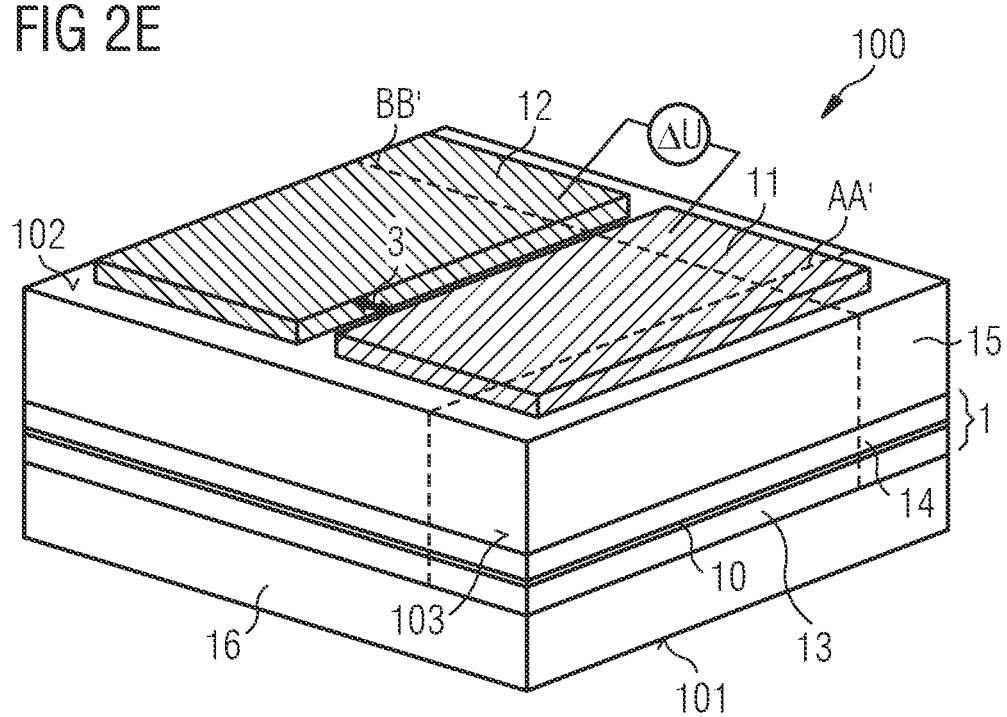

In the 3D view of the exemplary embodiment of FIG. 2E, unlike in the preceding exemplary embodiments, the growth substrate 16 is still arranged on the semiconductor layer sequence 1. In this case, the semiconductor layer sequence 1 is located between the growth substrate 16 and the carrier 15. The growth substrate 16 is, for example, a transparent substrate, such as a sapphire substrate, so that radiation can be coupled out of the component 100 or coupled in the component 100 via the growth substrate 16.

Figure 3A:
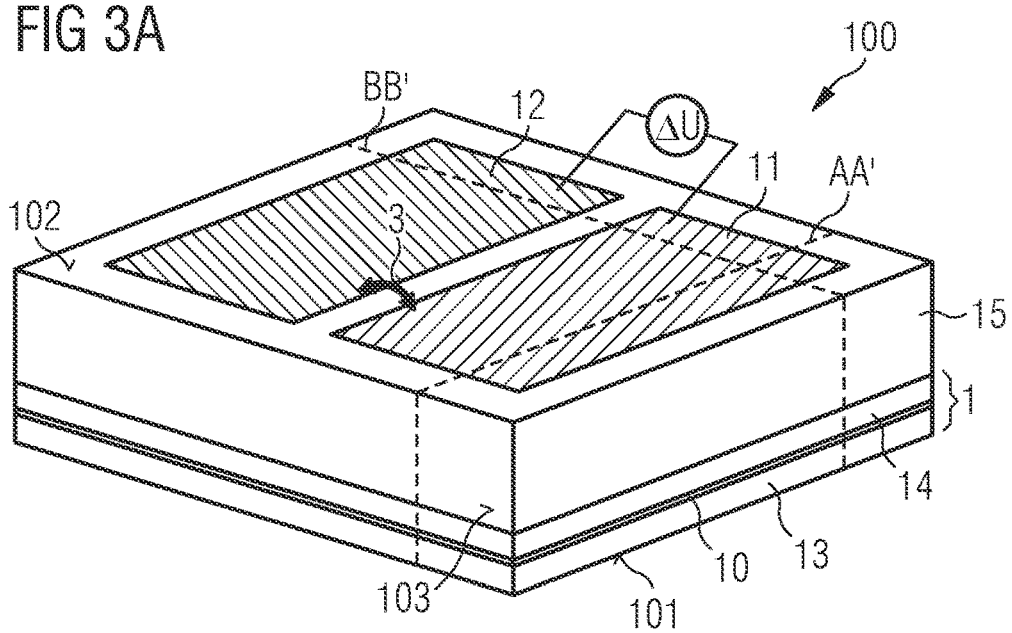
Figure 3B:
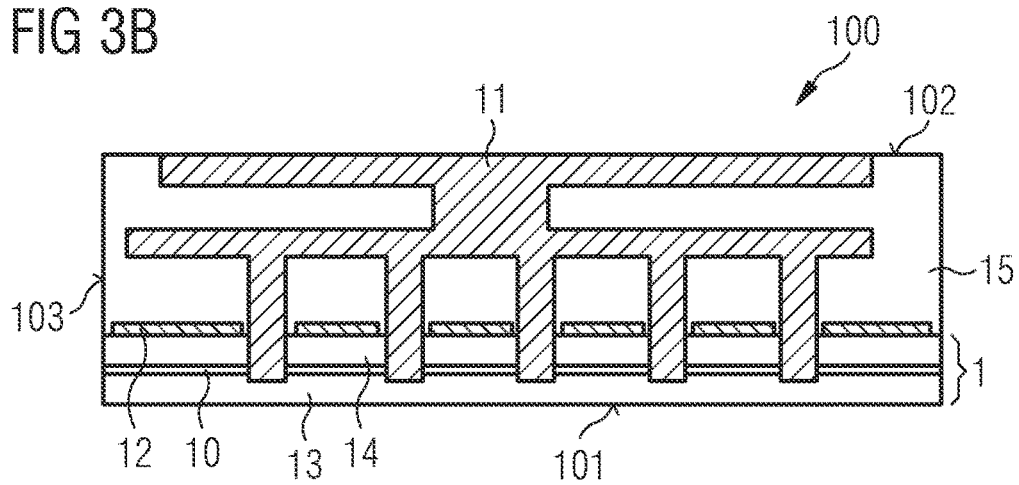
Figure 3C:
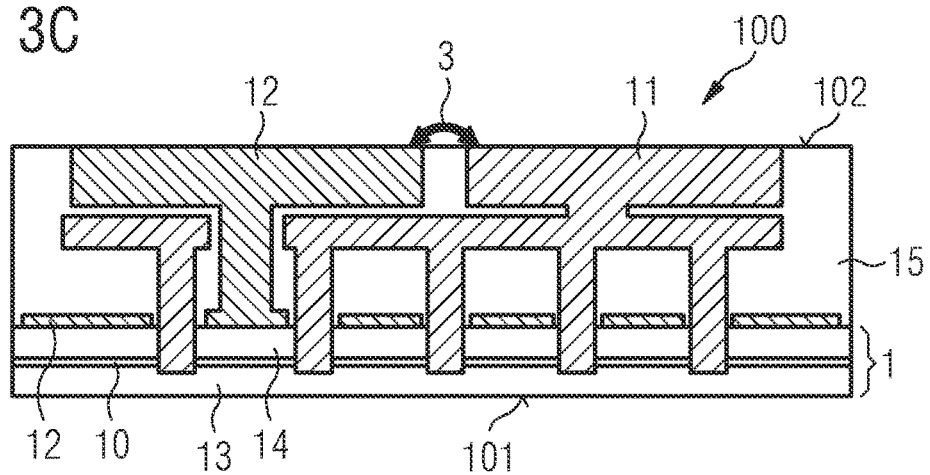

In the exemplary embodiment of FIGS. 3A to 3C, unlike in the exemplary embodiment of FIGS. 2A to 2C, the contact structures 11, 12 are each formed in one piece again and terminate flush with the carrier 15 on the rear side 102. So there are no separate contact elements applied to the contact structures 11, 12 at the rear side 102. Rather, in FIG. 3 the contact structures 11, 12 are brought together so closely in the region of the rear side 102 that a first flashover occurs between the contact elements 11, 12 in the region of the rear side 102 even without separate contact elements.

Figure 3D:
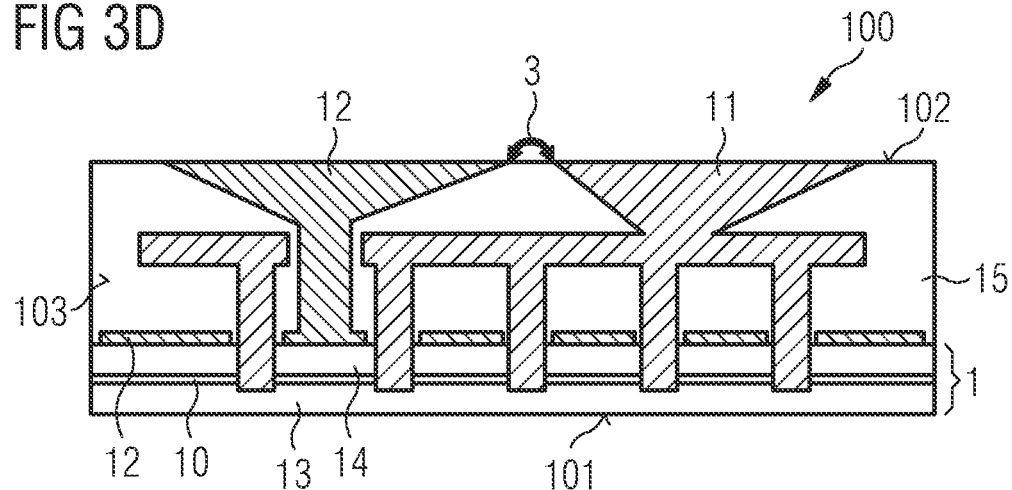

In FIG. 3D, as in FIG. 2D, the distance between the contact structures 11, 12 is initially reduced continuously in the direction away from the rear side 102.

Figure 3E:
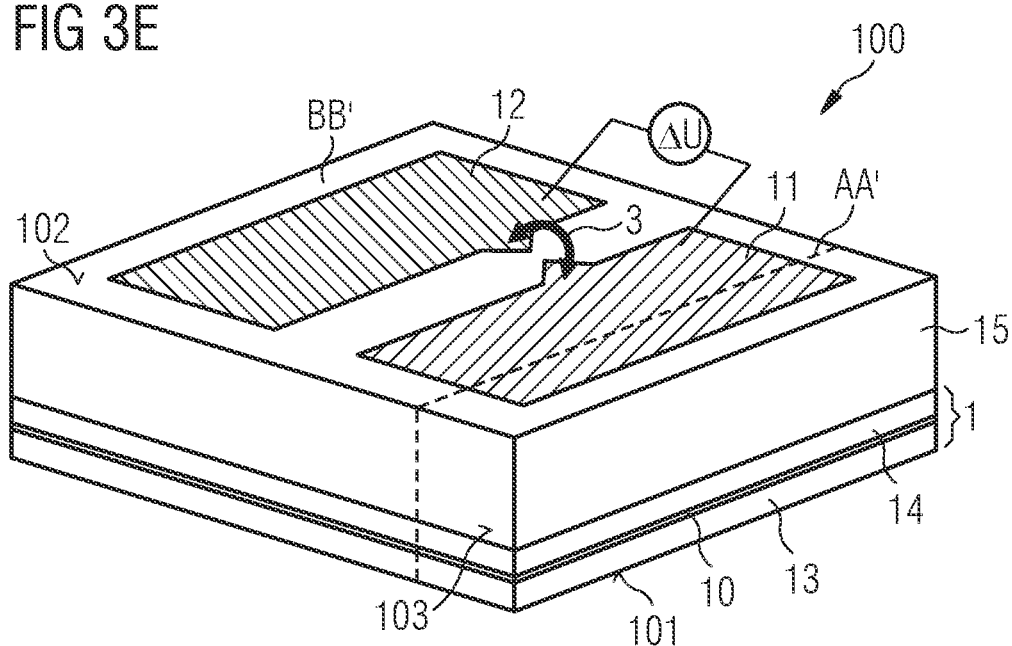

In the FIG. 3E an exemplary embodiment is shown as an alternative to the exemplary embodiment of FIG. 3A. In this case, the first contact structure 11 and the second contact structure 12 each have a tip on the rear side 102, which face each other. More specifically, in plan view of the rear side 102, the contact structures 11, 12 are rectangular elements, each having at one edge a protruding tip in the form of a triangular-shaped bulge. The bulges, for example, each have a height, measured from the base side formed by the edge to the tip, between 5 µm and 100 µm inclusive.

Particularly high field strengths arise between the tips between the first contact structure 11 and the second contact structure 12, so that the first electrical flashover then occurs in the region between the two mutually facing tips of the contact structures 11, 12. The actual distance between the tips then does not have to be chosen too small, which can be advantageous for the manufacturing process and for further processing.

Figure 4A:
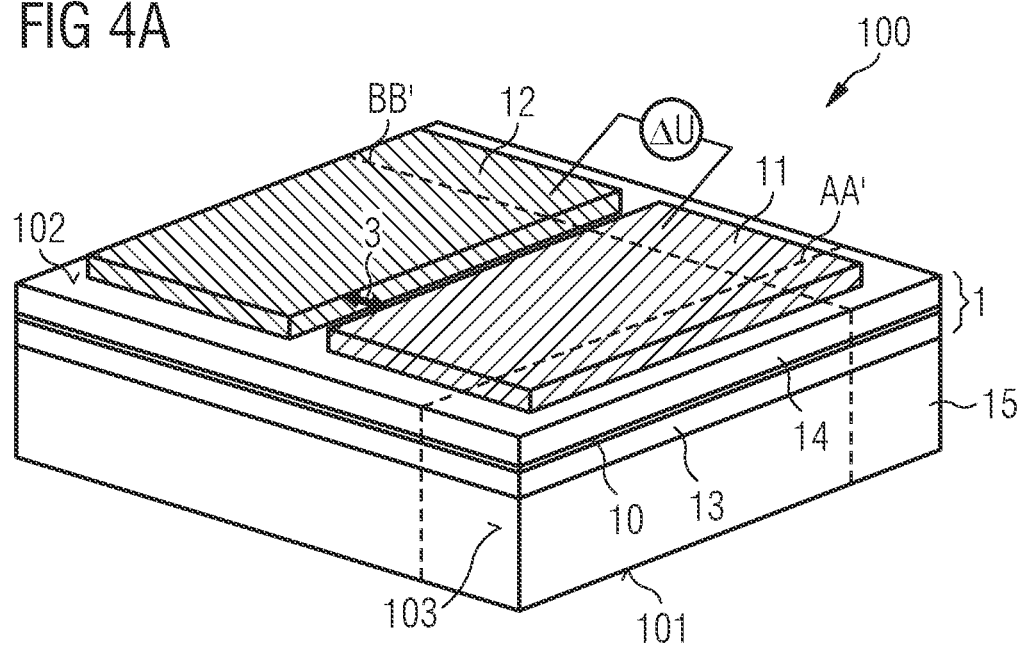
Figure 4B:
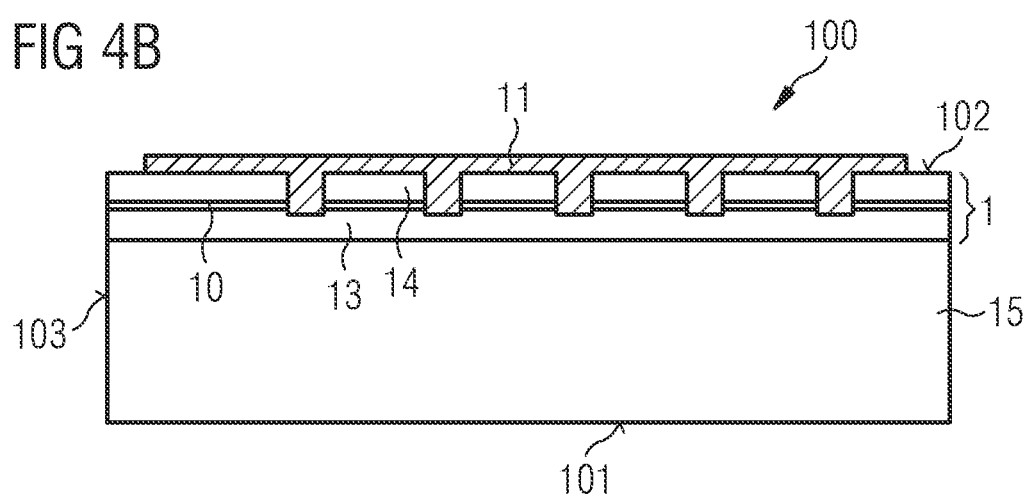
Figure 4C:
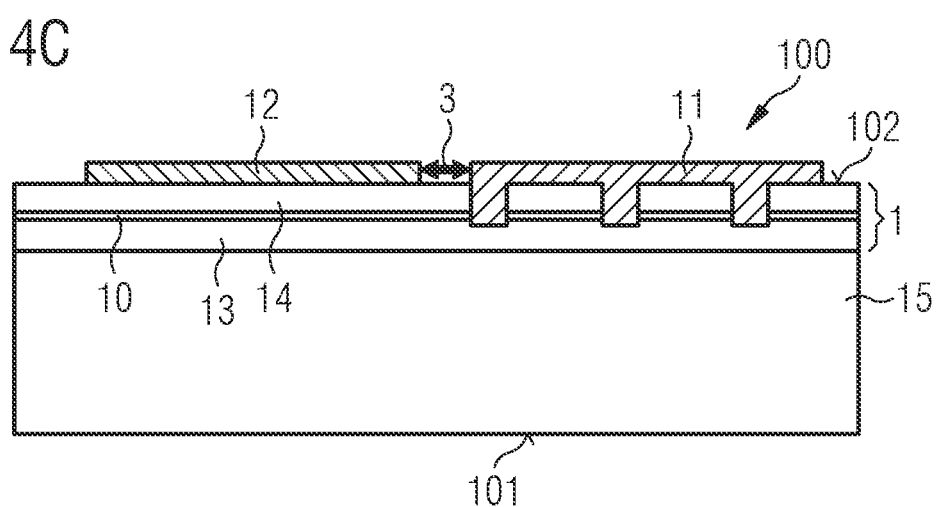

In the exemplary embodiment of FIGS. 4A to 4C, a so-called flip-chip is shown. In contrast to the components discussed so far, the carrier 15 is formed here by the growth substrate, for example a sapphire substrate, of the semiconductor layer sequence 1. Another support for stabilizing the component 100 is not required and not used. The semiconductor layer sequence 1 is formed between the rear side 102 and the carrier 15. The radiation side 101 is formed by the carrier 15 in this case. At the rear side 102, the contact structures 11, 12 are formed as protruding contact elements, between which the flashover and the spark gap 3 occurs. The distance between the contact structures 11, 12 on the rear side 102 is accordingly selected to be low.

It can be seen in FIGS. 4B and 4C that the first contact structure 11 is formed in one piece and is in direct electrical and mechanical contact with the first semiconductor layer 13. The second contact structure 12 is likewise formed in one piece and is in direct electrical and mechanical contact with the second semiconductor layer 14.

Figure 4D:
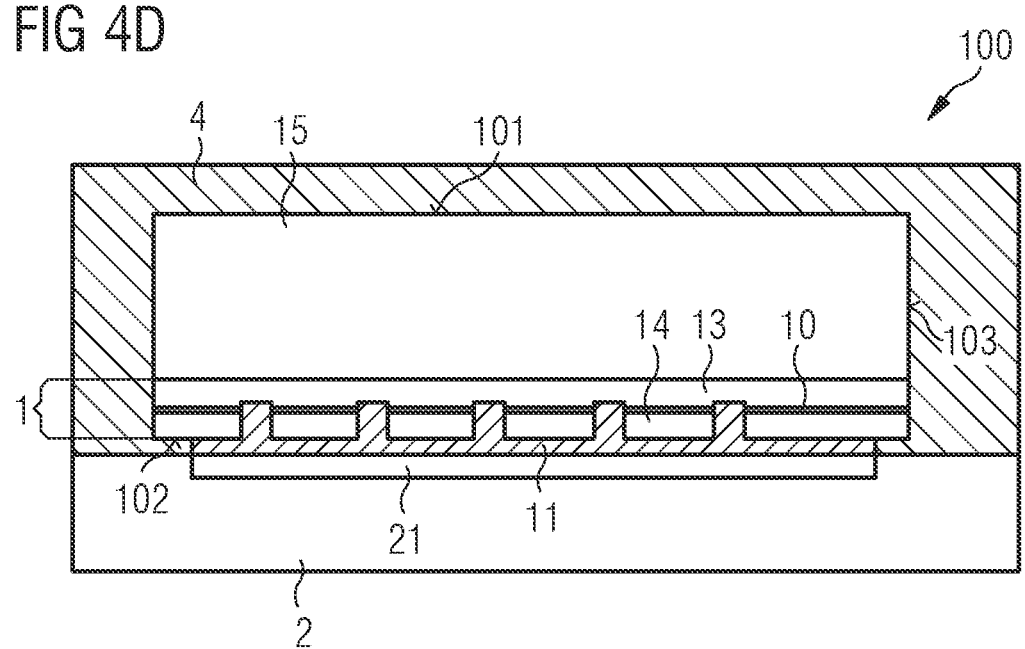
Figure 4E:
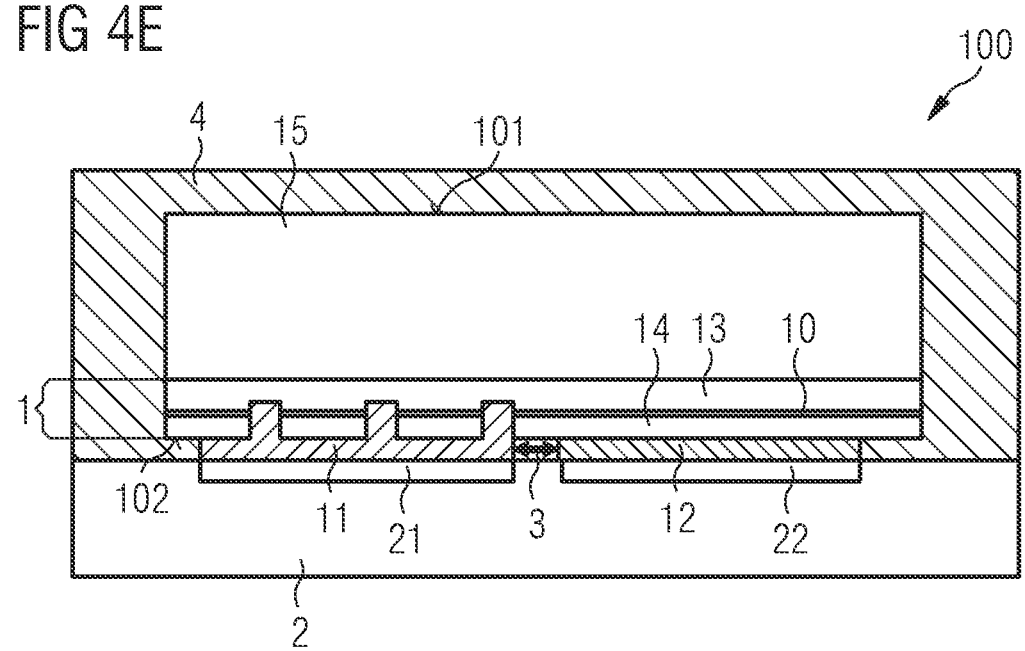

In FIGS. 4D and 4E, the flip-chip of FIGS. 4B and 4C is applied, for example soldered or glued, to a connection carrier 2. In this case, the contact structures 11, 12 face the connection carrier 2 and are each electrically conductively connected to a corresponding connection contact 21, 22 of the connection carrier 2. During operation the contact structures 11, 12 and thus the component 100 are electrically contacted and energized via the connection contacts 21, 22.

It can also be seen in FIGS. 4D and 4E that the flip-chips are encapsulated with a potting 4, for example made of silicone or epoxy resin. In particular, the potting 4 also fills the area between the two contact structures 11, 12. The first flashover or the spark gap 3 runs through the potting 4.

Figure 5A:
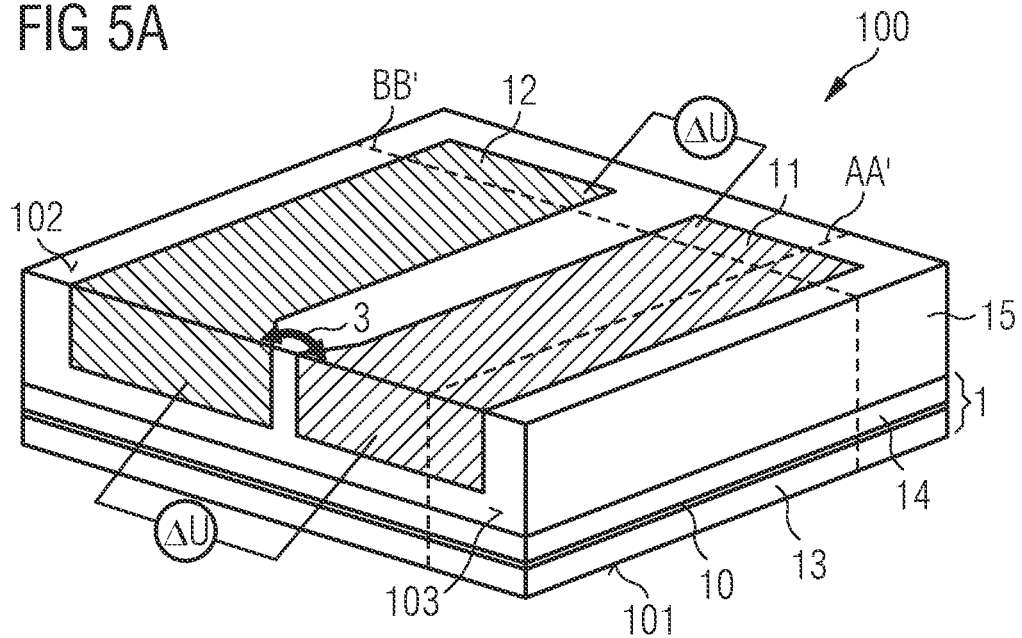
Figure 5B:
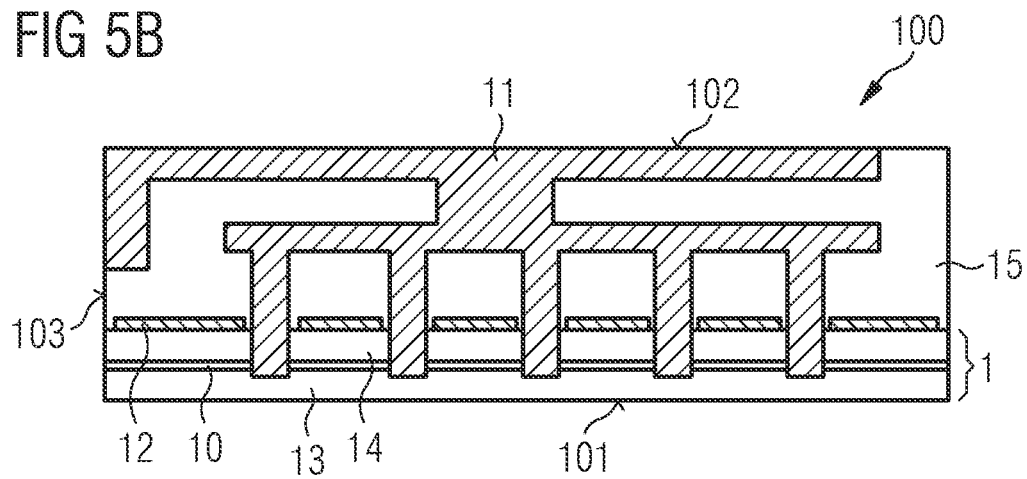
Figure 5C:
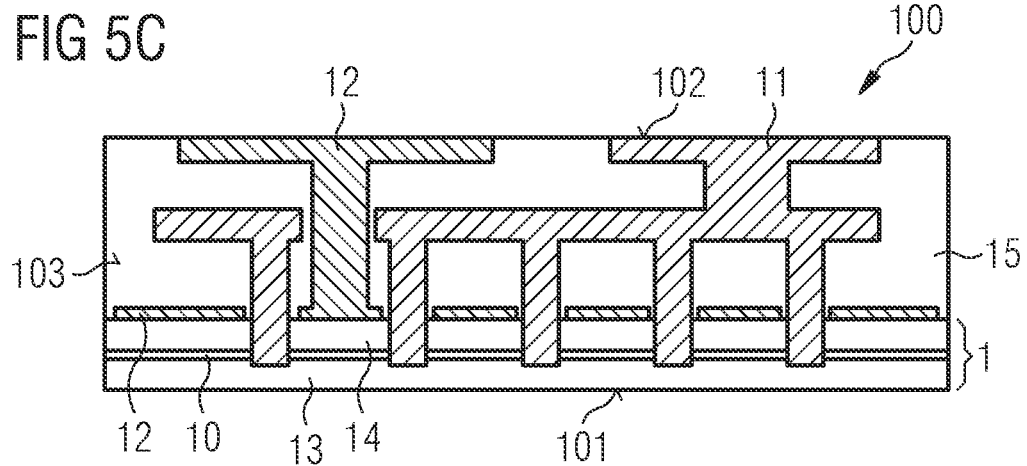

In the exemplary embodiment of FIGS. 5A to 5C, a component 100 which is similar to the components of FIGS. 1A to 3E is again shown. Again, the carrier 15 is formed between the rear side 102 and the semiconductor layer sequence 1. Unlike in the previous figures, however, the distance between the contact structures 11, 12 in the center of the rear side 102 is chosen such that no first flashover occurs there. Rather, the contact structures 11, 12 are brought closer together only in the region of an edge between the transverse side 103 and the rear side 102, so that the first flashover and the spark gap 3 occur in the region of the edge. Furthermore, it can be seen that the contact structures 11, 12 are also exposed on the transverse side.

Figure 6A:
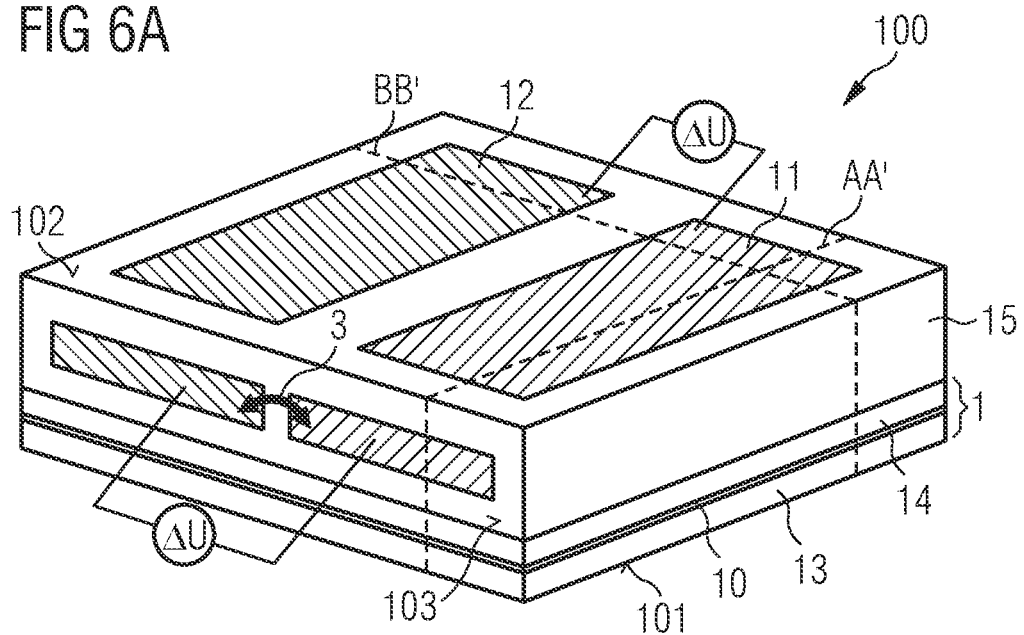
Figure 6B:
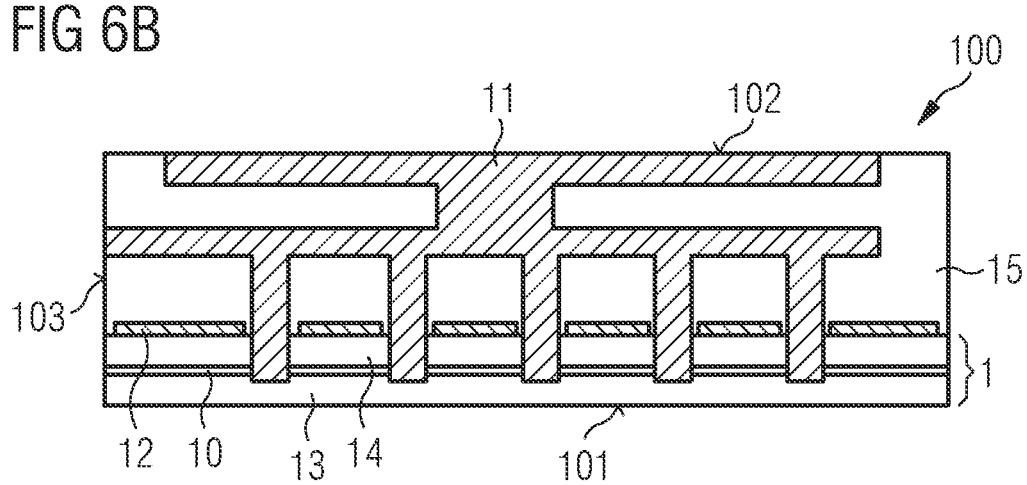
Figure 6C:
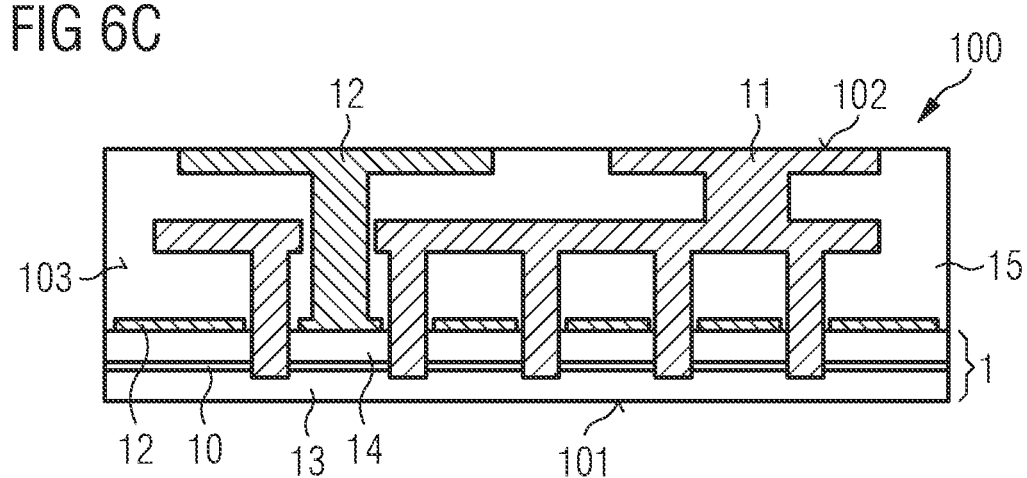

The exemplary embodiment of FIGS. 6A to 6C differs from the exemplary embodiment of FIGS. 5A to 5C in that the first contact structure 11 and the second contact structure 12 are not exposed continuously between the transverse side 103 and the rear side 102. Rather, the contact structures 11, 12 are not exposed in the region of the edge between the transverse side 103 and the rear side 102, but are covered by the material of the carrier 15. The first flashover and the spark gap 3 occur in the region of the transverse side 103, in which the contact structures 11, 12 are guided closer to one another than in the region of the rear side 102. The spark gap 3 occurs at a distance from the edge or from the rear side 102 of the component 100. Thus, the rear side 102 is spared from any damage caused by the spark gap 3.

In the exemplary embodiment of FIGS. 7A to 7F, a further exemplary embodiment of a component 100 is shown. Again, a semiconductor chip 100 is shown in which the carrier 15 is formed by the growth substrate of the semiconductor layer sequence 1. The semiconductor layer sequence 1 is formed between the radiation side 101 and the carrier 15. The semiconductor chip of FIGS. 7A to 7D is, for example, a so-called sapphire chip, in which case the growth substrate is sapphire.

Figure 7A:
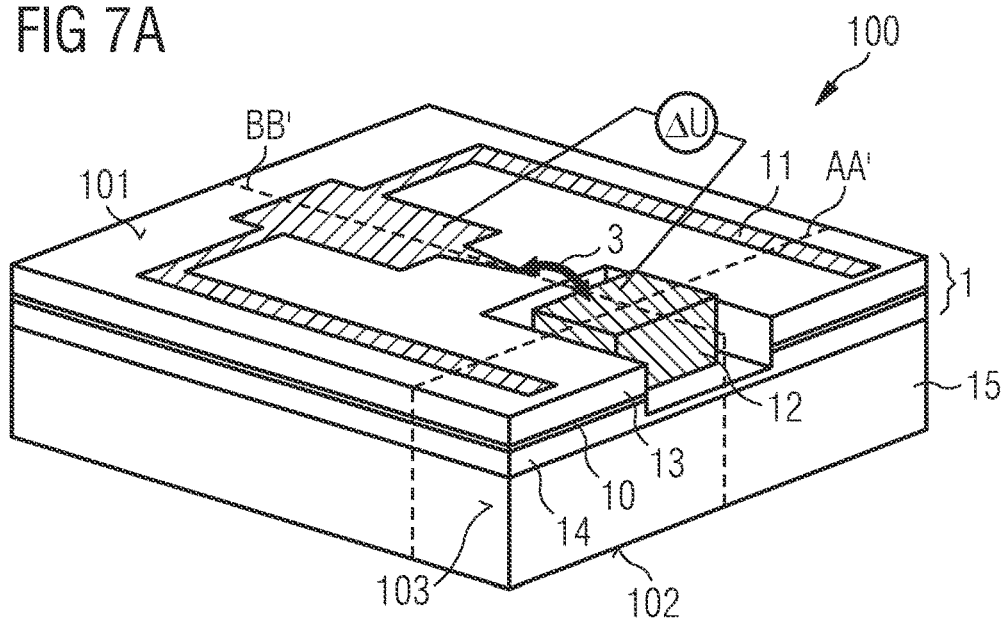

In FIG. 7A, it can be seen that the first contact structure 11 is formed as a current distribution structure on the first semiconductor layer 13. The first contact structure 11 is exposed on the radiation side 101 and is in direct contact with the first semiconductor layer 13. The second contact structure 12 is arranged in a recess in the semiconductor layer sequence 1 and is in direct electrical and mechanical contact with the second semiconductor layer 14. The recess extends completely from the radiation side 101 through the first layer 13 and the active layer 10 and opens into the second semiconductor layer 14.

In this case, the distance between the first contact structure 11 and the second contact structure 12 on the radiation side 101 is selected so that the first flashover and the spark gap 3 occurs in the region of the radiation side 101 and runs there predominantly through the surrounding medium.

Figure 7B:
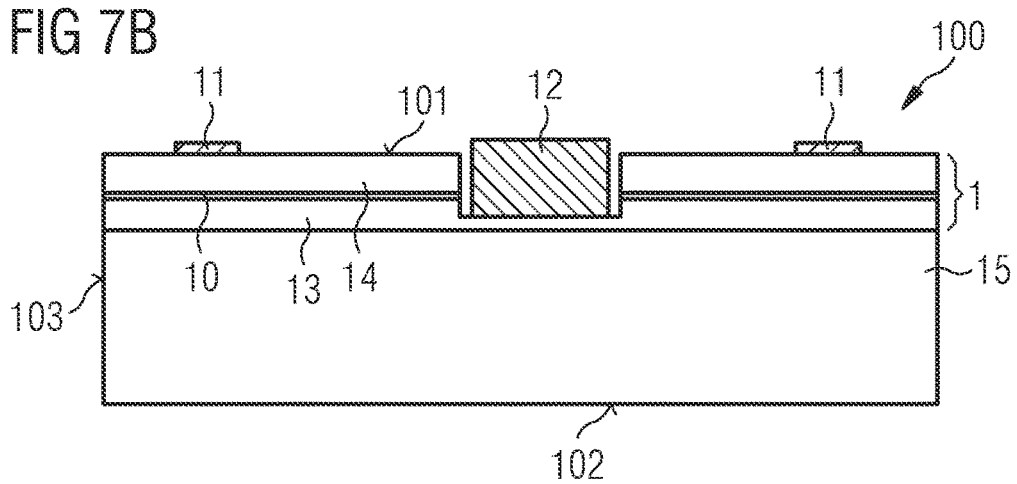
Figure 7C:
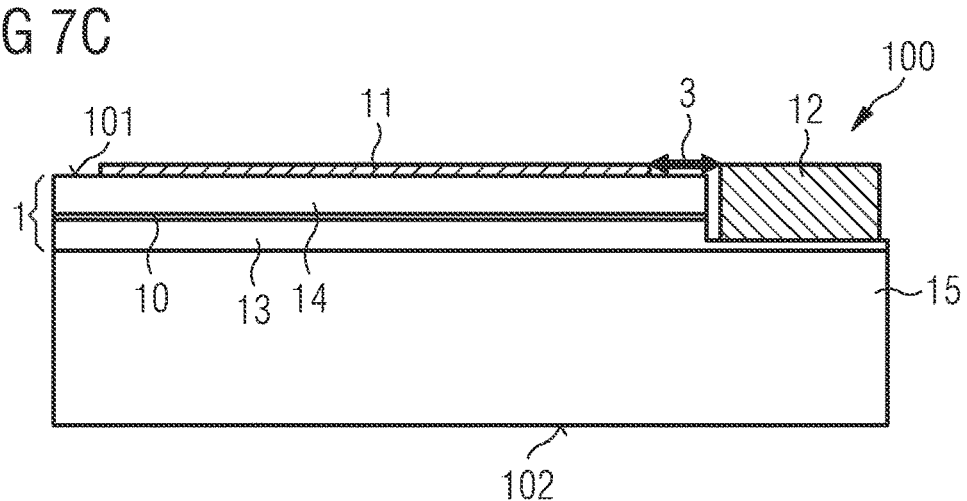

It can also be seen in FIGS. 7B and 7C that the second contact structure 12 projects beyond the semiconductor layer sequence 1 in the direction away from the carrier 15 within the recess. The shortest connection between the first contact structure 11 and the second contact structure 12, in particular the spark gap 3, therefore does not run through parts of the semiconductor layer sequence 1. In the event of a flashover, there is no damage to the semiconductor layer sequence 1.

Figure 7D:
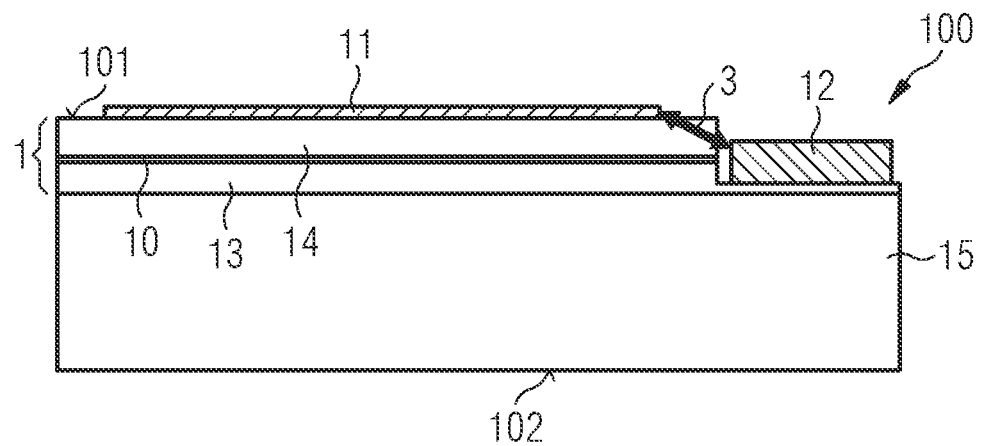

In contrast, FIG. 7D shows, how a spark gap 3 could run should the second contact structure 12 not project beyond the semiconductor layer sequence 1 in the direction away from the carrier 15. It can be seen that the spark gap 3 extends at least partially through the semiconductor layer sequence 1 and possibly damages the semiconductor layer sequence 1.

Figure 7E:
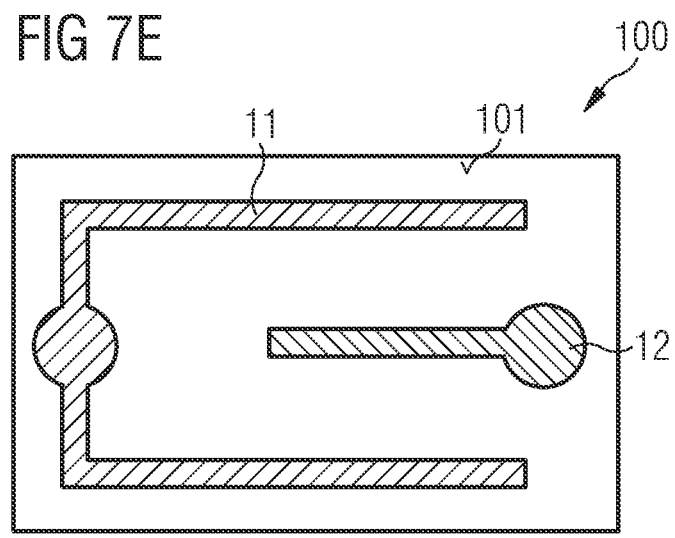
Figure 7F:
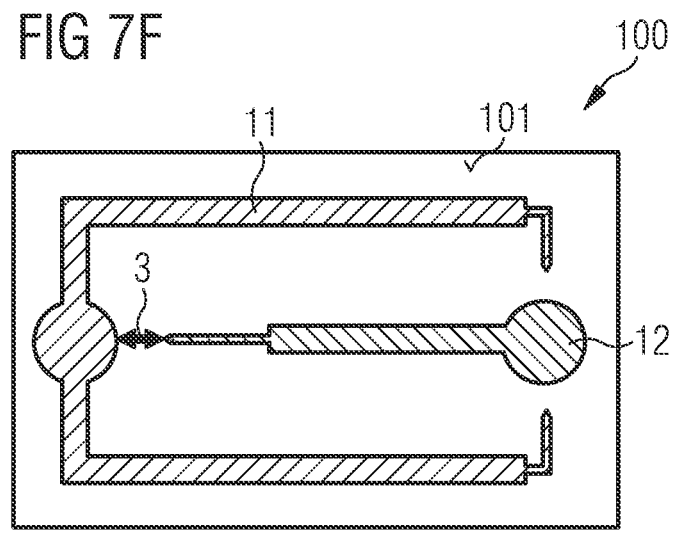

Plan views of the radiation side 101 are shown in FIGS. 7E and 7F. The contact structures 11, 12 form current distribution structures and are configured somewhat differently than in FIG. 7A. In particular, in FIG. 7F, the first contact structure 11 and the second contact structure 12 have intentionally introduced tips, from which a flashover between the first contact structure 11 and the second contact structure 12 preferably occurs.

Figure 8A:
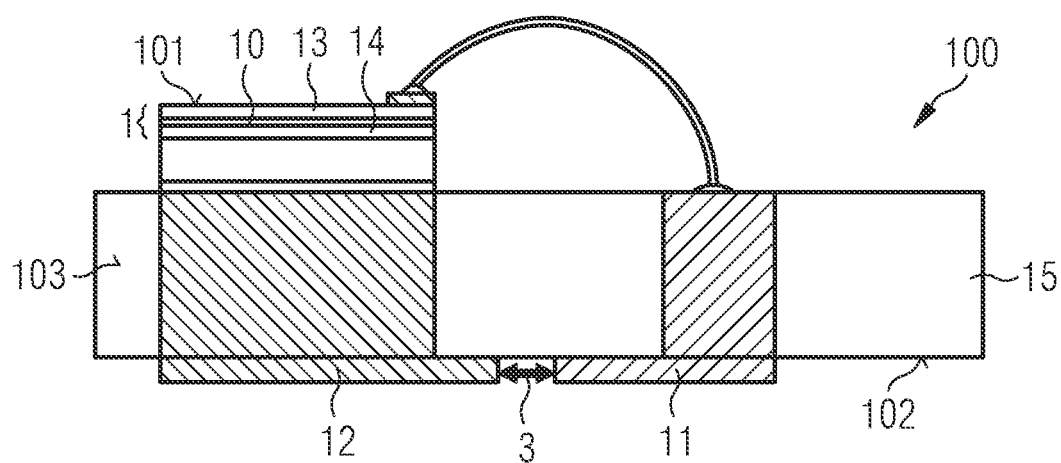
Figure 8B:
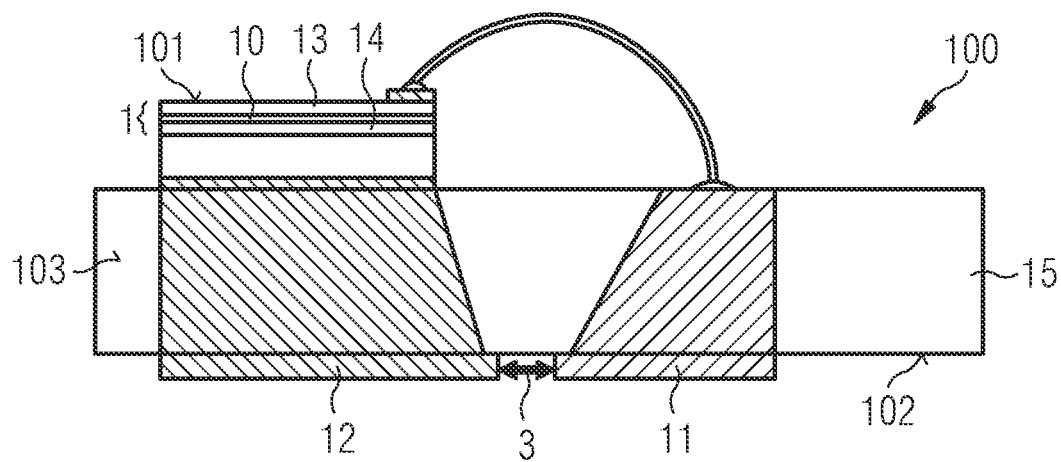

FIGS. 8A to 8B show an exemplary embodiment of a component 100 in the form of a light-emitting diode, each in cross-sectional view. A semiconductor chip is mounted on a carrier 15. The lateral extent of the carrier 15 and of the component 100 parallel to a main extension direction of the active layer 10 is at least twice as large as the lateral extent of the semiconductor chip or the semiconductor layer sequence 1. The carrier 15 is provided with vias which form parts of the contact structures 11, 12. The semiconductor chip is placed on the second contact structure 12 and electrically contacted via the contact structure 12. For contacting the semiconductor chip with the first contact structure 11, a bonding wire is used.

At the rear side 102 of the light-emitting diode 100, the first contact structure 11 and the second contact structure 12 are guided so close to one another that the first flashover and the spark gap 3 run through the surrounding medium in the region of the rear side 102.

In FIG. 8B, unlike in FIG. 8A, the distance between the contact structures 11, 12 in the direction away from the rear side 102 is reduced continuously. As a result, the danger of a flashover within the carrier 15 is further reduced.

Figure 8C:
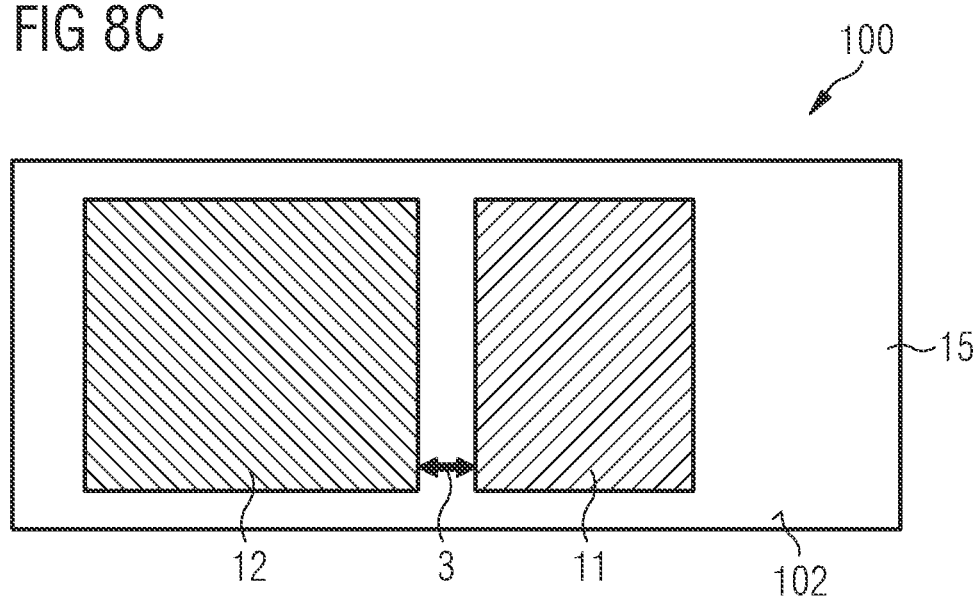

FIG. 8C shows a plan view of the rear side 102 of the component 100 from FIGS. 8A, 8B. It can be seen that the contact structures 11, 12 are brought together correspondingly close at the rear side 102.

Figure 8D:
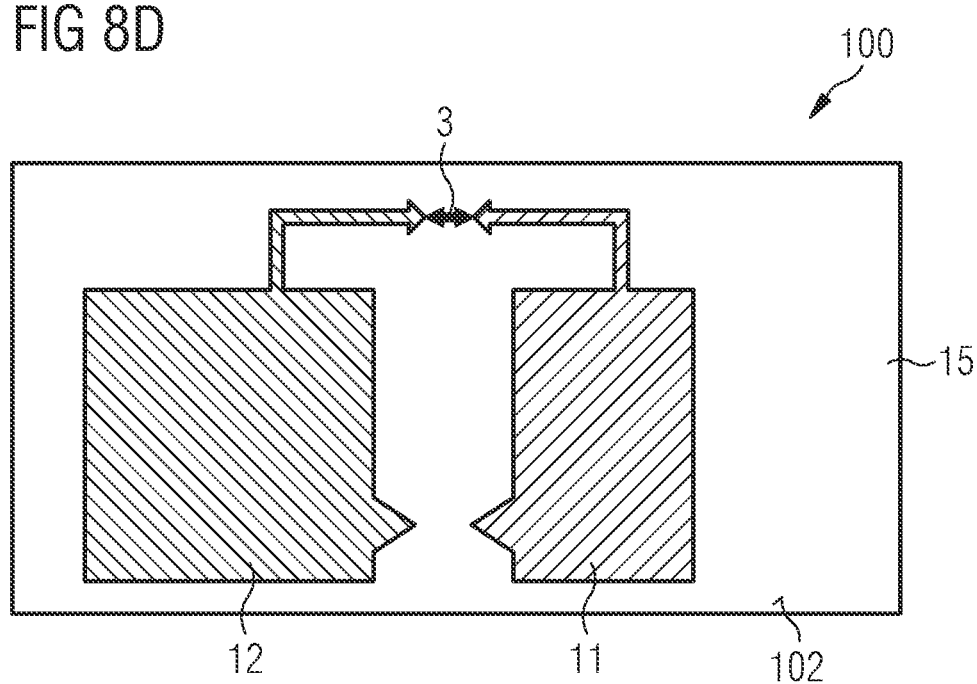

FIG. 8D shows an alternative embodiment of the rear side 102, wherein the first contact structure 11 and the second contact structure 12 each have mutually facing tips, in which the field strengths that are formed are particularly high, so that the spark gap 3 occurs between the mutually facing tips. The distance between the contact structures 11, 12 on the rear side 102 can therefore be selected to be larger than in FIG. 8C.

In the exemplary embodiments of FIGS. 8A to 8D, as in FIGS. 5A to 6C, the contact structures 11, 12 can also be guided to the transverse side 103, so that the spark gap 3 forms in the region of the transverse side 103.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

This patent application claims the priority of the German Patent Application 102015118234.3, the disclosure of which is hereby incorporated by reference.

LIST OF REFERENCE NUMBERS

1 Semiconductor layer sequence
2 connection carrier
3 spark gap 4 potting
10 active layer
11 first contact structure
12 second contact structure
13 first semiconductor layer
14 second semiconductor layer
15 carrier
16 growth substrate
21 connection contact
22 connection contact
100 optoelectronic component
101 radiation side
102 rear side
103 transverse side

The invention claimed is:

1. An optoelectronic component, comprising:
a semiconductor layer sequence with an active layer, wherein the active layer is set up to generate or absorb electromagnetic radiation during normal operation,
a first contact structure and a second contact structure via which the semiconductor layer sequence is electrically contacted during normal operation, wherein
during operation, the contact structures are subjected to a voltage and an operational voltage difference $\Delta U_{bet}$ between the contact structures occurs,
a first electrical flashover is formed in or on the component between the two contact structures when the voltage difference is increased,
a spark gap produced between the contact structures during the first flashover runs predominantly through a surrounding medium in the form of gas or vacuum and/or through a potting around the component,
the first flashover occurs at the earliest at a voltage difference of $2 \cdot \Delta U_{bet}$, wherein
an ESD protection circuit of the optoelectronic component is realized by the two contact structures, and
the first electrical flashover occurs at the earliest at a voltage difference of 3 V and at the latest at a voltage difference of 80 V.

2. An optoelectronic component according to claim 1, wherein
the contact structures adjoin at least in some regions directly to the surrounding medium and/or the potting,
the spark gap between the contact structures exclusively runs through the surrounding medium and/or the potting.

3. The optoelectronic component according to claim 1, wherein
a passivation layer is at least partially arranged between the contact structures and the surrounding medium,
the spark gap between the contact structures passes through the passivation layer and runs to at least 90% through the surrounding medium and/or the potting.

4. Optoelectronic component according to claim 1, wherein in the region of the forming spark gap the minimum distance between the two contact structures is at most 50 µm.

5. Optoelectronic component according to claim 1, wherein the contact structures each have a tip or edge and the spark gap is formed between the tips or edges.

6. Optoelectronic component according to claim 1, wherein
the contact structures are in direct contact with semiconductor layers of the semiconductor layer sequence,
the contact structures are each formed in one piece,
the contact structures comprise metal or consist thereof.

7. Optoelectronic component according to claim 1, wherein the contact structures are contact elements for external electrical contacting, which are exposed in the unmounted state of the component on a side surface of the component.

8. Optoelectronic component according to claim 1, wherein the contact structures are current distribution structures of the semiconductor layer sequence.

9. The optoelectronic component according to claim 1, further comprising:—a radiation side for coupling or decoupling the electromagnetic radiation into or out of the component,
a rear side opposite of the radiation side,
at least one transverse side connecting the radiation side and the rear side,
a carrier carrying the semiconductor layer sequence between the semiconductor layer sequence and the radiation side or between the semiconductor layer sequence and the rear side, wherein
the semiconductor layer sequence comprises a first semiconductor layer facing the radiation side and a second semiconductor layer facing away from the radiation side, wherein the active layer is arranged between the first semiconductor layer and the second semiconductor layer,
the first contact structure is electrically conductively connected to the first semiconductor layer,
the second contact structure is electrically conductively connected to the second semiconductor layer,
the spark gap occurs in the region of the rear side or in the region of the radiation side or in the region of the transverse side.

10. The optoelectronic component according to claim 9, wherein
the spark gap occurs in the region of the radiation side,
the semiconductor layer sequence is arranged between the carrier and the radiation side,
the first contact structure is arranged on a side of the first semiconductor layer facing away from the carrier,
the second contact structure is arranged on a side of the second semiconductor layer facing away from the carrier within a recess in the first semiconductor layer,
the second contact structure projects beyond the first semiconductor layer on the radiation side in the direction away from the carrier,
the shortest connection between the two contact structures does not cross any part of the semiconductor layer sequence,
the spark gap does not pass parts of the semiconductor layer sequence.

11. An optoelectronic component according to claim 9, wherein
the carrier is formed between the rear side and the semiconductor layer sequence,
the contact structures form at least parts of vias through the carrier,
in the unmounted configuration of the component the contact structures are exposed as contact elements at the rear side.

12. An optoelectronic component according to claim 11, wherein
in the region of the carrier the contact structures are additionally guided to the transverse side,
the spark gap occurs in the region of the transverse side.

13. An optoelectronic component according to claim 12, wherein
an edge between the rear side and the transverse side is free of the contact structures,
the spark gap occurs spaced apart from the rear side.

14. An optoelectronic component according to claim 12, wherein
the contact structures are guided to an edge between the transverse side and the rear side,
the spark gap occurs or can occur in the region of the edge.

15. Optoelectronic component according to claim 1, wherein
the optoelectronic component is a semiconductor chip,
a lateral extent of the semiconductor layer sequence essentially corresponds to the lateral extent of the semiconductor chip and/or of the carrier.

16. Optoelectronic component according to claim 1, wherein
the optoelectronic component is a light-emitting diode with an optoelectronic semiconductor chip mounted on a carrier,
the semiconductor chip comprises the semiconductor layer sequence,
the carrier has a lateral extent at least twice as large as the semiconductor layer sequence.

17. A method for operating an optoelectronic semiconductor chip comprising the steps:
A) providing an optoelectronic semiconductor chip having a first contact structure and a second contact structure, wherein the semiconductor chip further comprises a radiation side for coupling or decoupling the electromagnetic radiation into or out of the semiconductor chip, a rear side opposite of the radiation side, at least one transverse side connecting the radiation side and the rear side, and a carrier carrying a semiconductor layer sequence between the semiconductor layer sequence and the rear side;
B) electrically contacting the optoelectronic semiconductor chip via the first and second contact structures;
C) switching on and off of the optoelectronic semiconductor chip by controlled switching on and off of a current flow through the optoelectronic semiconductor chip, wherein
in the switched-on state of the optoelectronic semiconductor chip an intended voltage difference $\Delta U_{bet}$ is applied between the two contact structures and the optoelectronic semiconductor chip emits electromagnetic radiation,
in the switched-on and/or switched-off state, voltage peaks occur at the semiconductor chip in which the voltage difference between the two contact structures increases to values greater than $\Delta U_{bet}$,
during some voltage peaks, a first electrical flashover forms in or on the semiconductor chip between the two contact structures,
a spark gap produced between the contact structures during the first flashover runs predominantly through a surrounding medium in the form of gas or vacuum and/or through a potting around the semiconductor chip,
the first flashover occurs at the earliest at a voltage difference of $2 \cdot \Delta U_{bet}$,
the spark gap occurs in the region of the rear side or in the region of the radiation side or in the region of the transverse side, and
the first electrical flashover occurs at the earliest at a voltage difference of 3 V and at the latest at a voltage difference of 80 V.

18. An optoelectronic semiconductor chip, comprising:
a semiconductor layer sequence with an active layer, wherein the active layer is set up to generate or absorb electromagnetic radiation during normal operation,
a first contact structure and a second contact structure via which the semiconductor layer sequence is electrically contacted during normal operation,
a radiation side for coupling or decoupling the electromagnetic radiation into or out of the semiconductor chip,
a rear side opposite of the radiation side,
at least one transverse side connecting the radiation side and the rear side,
a carrier carrying the semiconductor layer sequence between the semiconductor layer sequence and the rear side, wherein
during operation, the contact structures are subjected to a voltage and an operational voltage difference $\Delta U_{bet}$ between the contact structures occurs,
a first electrical flashover is formed in or on the semiconductor chip between the two contact structures when the voltage difference is increased,
a spark gap produced between the contact structures during the first flashover runs predominantly through a surrounding medium in the form of gas or vacuum and/or through a potting around the semiconductor chip,
the first flashover occurs at the earliest at a voltage difference of $2 \cdot \Delta U_{bet}$,
the semiconductor layer sequence comprises a first semiconductor layer facing the radiation side and a second semiconductor layer facing away from the radiation side, wherein the active layer is arranged between the first semiconductor layer and the second semiconductor layer,
the first contact structure is electrically conductively connected to the first semiconductor layer,
the second contact structure is electrically conductively connected to the second semiconductor layer,
the first contact structure is arranged on a side of the first semiconductor layer facing away from the carrier,
the second contact structure is arranged on a side of the second semiconductor layer facing away from the carrier within a recess in the first semiconductor layer,
the second contact structure projects beyond the first semiconductor layer on the radiation side in the direction away from the carrier,
the shortest connection between the two contact structures does not cross any part of the semiconductor layer sequence,
the spark gap occurs in the region of the rear side or in the region of the radiation side.

\* \* \* \* \*